United States Patent
Harumoto et al.

(10) Patent No.: US 8,530,899 B2
(45) Date of Patent: Sep. 10, 2013

(54) THIN FILM TRANSISTOR, DISPLAY DEVICE, AND MANUFACTURING METHOD FOR THIN FILM TRANSISTOR AND DISPLAY DEVICE

(75) Inventors: Yoshiyuki Harumoto, Osaka (JP); Takeshi Hara, Osaka (JP); Tohru Okabe, Osaka (JP); Takeshi Yaneda, Osaka (JP); Tetsuya Aita, Osaka (JP); Tsuyoshi Inoue, Osaka (JP); Michiko Takei, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/518,566

(22) PCT Filed: Dec. 21, 2010

(86) PCT No.: PCT/JP2010/073009
§ 371 (c)(1),
(2), (4) Date: Jul. 26, 2012

(87) PCT Pub. No.: WO2011/078169
PCT Pub. Date: Jun. 30, 2011

(65) Prior Publication Data
US 2013/0105802 A1    May 2, 2013

(30) Foreign Application Priority Data
Dec. 25, 2009 (JP) ................... 2009-295190

(51) Int. Cl.
*H01L 29/04* (2006.01)

(52) U.S. Cl.
USPC ................ 257/59; 257/72; 257/258

(58) Field of Classification Search
USPC .............................. 257/59, 72, 258
See application file for complete search history.

(56) References Cited

U.S. PATENT DOCUMENTS
6,204,519 B1    3/2001    Yamazaki et al.

FOREIGN PATENT DOCUMENTS
| JP | 7-176747 A | 7/1995 |
| JP | H09-246564 A | 9/1997 |
| JP | 2003-133328 A | 5/2003 |
| JP | 2009-290168 A | 12/2009 |

*Primary Examiner* — Tan N Tran
(74) *Attorney, Agent, or Firm* — Chen Yoshimura LLP (57) ABSTRACT

The present invention has an object of providing a TFT in which generation of an OFF current is reduced by an efficient manufacturing method. A thin film transistor 100 according to the present invention has a gate electrode 12 formed on a substrate 10, an insulating layer 14 formed on the gate electrode 12, a microcrystalline amorphous silicon layer 18 and an amorphous silicon layer 16 that are formed on the insulating layer 14, a semiconductor layer 20 containing an impurity formed on the amorphous silicon layer 16, and a source electrode 22A and a drain electrode 22B that are formed on the semiconductor layer 20 containing an impurity. The microcrystalline amorphous silicon layer 18 and the semiconductor layer 20 containing an impurity are connected to each other through the amorphous silicon layer 16 without being in direct contact with each other.

8 Claims, 5 Drawing Sheets

THIN FILM TRANSISTOR, DISPLAY DEVICE, AND MANUFACTURING METHOD FOR THIN FILM TRANSISTOR AND DISPLAY DEVICE

TECHNICAL FIELD

The present invention relates to a thin film transistor (TFT). Furthermore, the present invention relates to a thin film transistor that is used in a display device such as a liquid crystal display device and an organic EL display device, and to a display device having the thin film transistor.

BACKGROUND ART

Traditionally, as a TFT (Thin Film Transistor) of an active matrix substrate in a display device such as a liquid crystal display device, a non-crystalline (amorphous) silicon TFT, a microcrystalline silicon TFT, a polycrystalline silicon (polysilicon) TFT, and the like have been used.

The amorphous silicon TFT is suitable for a TFT of a display device that requires a large surface because it is possible to form an amorphous silicon film in a relatively simple manner. Therefore, many active matrix substrates that are used in liquid crystal televisions having relatively large screens use the amorphous silicon TFTs.

The microcrystalline silicon TFT and the polycrystalline silicon TFT have high mobility of electrons and holes in semiconductor layers, and have high ON currents. Because of this, they have an advantage of being able to charge a pixel capacitance of a liquid crystal display device or the like in short switching time. Further, when the microcrystalline silicon TFT and the polycrystalline silicon TFT are used, there is also an advantage that a peripheral circuit such as a driver can be built in an active matrix substrate partially or completely.

Figure 10:
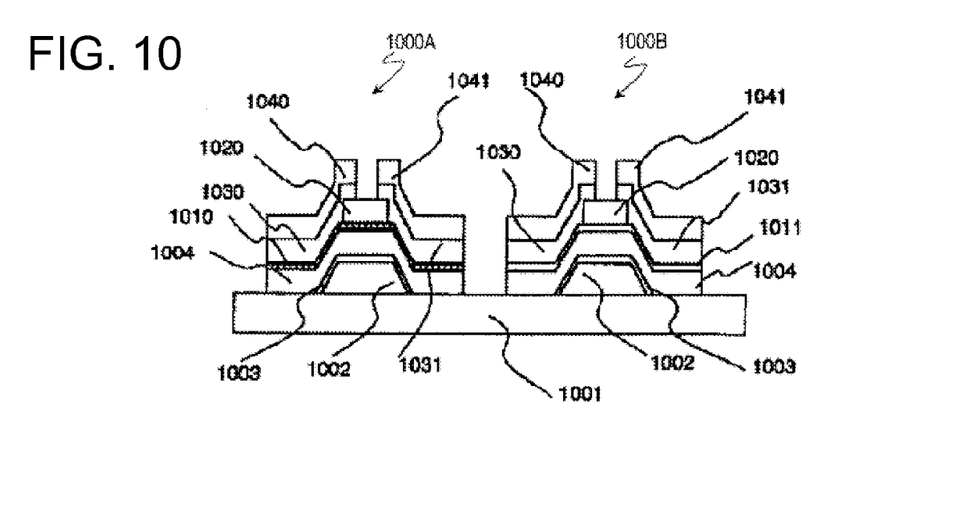
FIG. 10 is a cross-sectional view showing a configuration of a semiconductor device according to Patent Document 1.

An example of a semiconductor device that includes a polysilicon TFT is described in Patent Document 1. FIG. 10 shows a cross-sectional configuration of the semiconductor device according to Patent Document 1.

As shown in FIG. 10, the semiconductor device of Patent Document 1 has a polysilicon TFT 1000A and an amorphous silicon TFT 1000B that are formed on a single substrate 1001. The polysilicon TFT 1000A and the amorphous silicon TFT 1000B are both bottom gate type TFTs having a reverse stagger structure, and are formed on the substrate 1001 at the same time. The polysilicon TFT 1000A is used as a TFT for a driver circuit in a liquid crystal display device. The amorphous silicon TFT 1000B is used as a switching element inside a pixel of the liquid crystal display device.

Both the polysilicon TFT 1000A and the amorphous silicon TFT 1000B are constituted of a gate electrode 1002, a gate AO film (anode oxidation film) 1003, a gate insulating film 1004, an active layer, an etch stopper 1020, a source region 1030 and a drain region 1031 that are semiconductor layers containing an impurity, a source electrode 1040, and a drain electrode 1041, all of which are formed on the substrate 1001. The active layer of the polysilicon TFT 1000A is a polysilicon active layer 1010, and the active layer of the amorphous silicon TFT 1000B is an amorphous silicon active layer 1011.

When manufacturing this semiconductor device, a portion of amorphous silicon formed on the gate insulating film 1004 becomes the amorphous silicon active layer 1011. Another portion is irradiated with an excimer laser or light of a halogen lamp to be crystallized, thereby turning into the polysilicon active layer 1010. In the polysilicon TFT 1000A, the source region 1030 and the drain region 1031 are laminated after the polysilicon active layer 1010 has been formed from the amorphous silicon.

RELATED ART DOCUMENTS

Patent Document

Patent Document 1: Japanese Patent Application Laid-Open Publication No. H9-246564

SUMMARY OF THE INVENTION

Problems to be Solved by the Invention

In the semiconductor device of Patent Document 1, the entire lower surfaces of the source region 1030 and the drain region 1031 of the polysilicon TFT 1000A are in direct contact with the polysilicon active layer 1010. Because of this, there is a problem of a high OFF current being generated.

When the polysilicon TFT 1000A is in an OFF state, in other words, when a negative voltage is applied to the gate electrode 1002 and a positive voltage is applied to the drain electrode 1041, the density of lines of electric force increases in the drain region 1031 between the gate electrode 1002 and the drain electrode 1041. Because the polysilicon has a smaller band gap and higher conductivity as compared with the amorphous silicon, there may be a problem of a higher OFF current flowing as the negative voltage applied to the gate electrode 1002 decreases.

The present invention seeks to address the problems described above, and has an object of providing a thin film transistor that has a reduced OFF current and a small leakage current. Furthermore, another object of the present invention is to provide the thin film transistor in which the OFF current is reduced by an efficient manufacturing method.

Means for Solving the Problems

A thin film transistor according to the present invention has a gate electrode formed on a substrate, an insulating layer formed so as to cover the gate electrode, a microcrystalline amorphous silicon layer and an amorphous silicon layer that are formed on the insulating layer, a semiconductor layer containing an impurity formed on the amorphous silicon layer, and a source electrode and a drain electrode that are formed on the semiconductor layer containing an impurity. The microcrystalline amorphous silicon layer and the semiconductor layer containing an impurity are connected to each other through the amorphous silicon layer without being in direct contact with each other.

In an embodiment, the semiconductor layer containing an impurity includes a first contact portion that is in contact with the source electrode and a second contact portion that is in contact with the drain electrode. When viewed in a cross-section that is normal to a plane of the substrate and that cuts across the source electrode and the drain electrode, the width of the microcrystalline amorphous silicon layer is narrower than the width of a space between the first contact portion and the second contact portion.

In an embodiment, when viewed in the cross-section, the width of a space between the source electrode and the drain electrode is narrower than the width of the space between the first contact portion and the second contact portion.

In an embodiment, when viewed in the cross-section, the width of the space between the source electrode and the drain electrode becomes wider as it approaches the first contact portion and the second contact portion.

In an embodiment, the amorphous silicon layer includes a first amorphous silicon portion that is in contact with the first contact portion and a second amorphous silicon portion that is in contact with the second contact portion. The microcrystalline amorphous silicon layer is disposed between the first amorphous silicon portion and the second amorphous silicon portion. The first amorphous silicon portion and the second amorphous silicon portion are in contact with only side surfaces of the microcrystalline amorphous silicon layer.

In an embodiment, the source electrode and the drain electrode are formed of titanium.

A display device according to the present invention is a display device having a TFT substrate in which the thin film transistor of the present invention is disposed in each pixel.

A display device according to an embodiment has a plurality of pixels arranged in a matrix, and the thin film transistors and pixel electrodes are disposed corresponding to the plurality of pixels, respectively. The pixel electrodes are formed on a protective layer that is formed so as to cover the thin film transistors.

In an embodiment, an interlayer insulating film is formed between the pixel electrodes and the protective layer.

A method of manufacturing a thin film transistor according to the present invention includes the following steps: forming a gate electrode on a substrate; forming an insulating layer so as to cover the gate electrode; forming an amorphous silicon layer on the insulating layer; forming a semiconductor layer containing an impurity on the amorphous silicon layer; forming a metal layer on the semiconductor layer containing an impurity; patterning the metal layer to form a source electrode, a drain electrode, and a first gap between the source electrode and the drain electrode and patterning the semiconductor layer containing an impurity to form a first contact portion, a second contact portion, and a second gap between the first contact portion and the second contact portion; and irradiating the amorphous silicon layer with light through the first gap and the second gap to form a microcrystalline amorphous silicon layer in a portion of the amorphous silicon layer. In the patterning step, the metal layer and the semiconductor layer containing an impurity are patterned such that the width of the second gap becomes wider than the width of the first gap. In the light irradiation step, the microcrystalline amorphous silicon layer is formed so as to have a width that is narrower than the width of the second gap.

In an embodiment, a gap in which the width of an upper portion thereof is narrower than the width of a lower portion thereof is formed in the metal layer in the patterning step.

In an embodiment, the microcrystalline amorphous silicon layer is formed so as not to be in direct contact with the semiconductor layer containing an impurity in the light irradiation step.

In an embodiment, the patterning step is performed using a photolithography method that includes a step of applying a resist on the metal layer and a baking step of heating the resist. In the baking step, the resist is heated to a temperature of 150° C. or more and 160° C. or less.

In an embodiment, the metal layer is patterned by a wet etching method, and the semiconductor layer containing an impurity is patterned by a dry etching method in the patterning step.

In an embodiment, the metal layer is formed of titanium.

In an embodiment, a first amorphous silicon portion that is in contact with the first contact portion and a second amorphous silicon portion that is in contact with the second contact portion are formed from the amorphous silicon layer such that the microcrystalline amorphous silicon layer is disposed therebetween in the light irradiation step.

A method of manufacturing a display device according to the present invention includes forming a protective layer on a thin film transistor formed by a manufacturing method of the present invention and forming a pixel electrode on the protective layer.

A method of manufacturing a display device according to an embodiment includes forming an interlayer insulating film between the pixel electrode and the protective layer.

Here, the present invention also includes a circuit board having a thin film transistor of the present invention and a circuit board having a thin film transistor that is manufactured by a manufacturing method of the present invention. Furthermore, a display device, such as a liquid crystal display device, an organic EL (electroluminescence) display device, or the like, and an imaging device that have a thin film transistor of the present invention are also included in the invention of the present application.

Effects of the Invention

According to the thin film transistor and the display device of the present invention, the semiconductor layer containing an impurity and the microcrystalline amorphous silicon layer are not in direct contact with each other, and are connected to each other through the amorphous silicon layer disposed therebetween. Because of this, driving up of an OFF current of the TFT is suppressed, and a leakage current is reduced. Further, in the thin film transistor of the present invention, the semiconductor layer includes microcrystalline silicon. Therefore, the thin film transistor of the present invention has excellent ON current characteristics. When manufacturing this thin film transistor, there is no need to newly add a special step. As a result, it is possible to provide a high-quality thin film transistor by an efficient manufacturing method.

BRIEF DESCRIPTION OF THE DRAWINGS

FIGS. 2(*a*) to 2(*f*) are cross-sectional views schematically showing a manufacturing method of the thin film transistor 100.

FIGS. 8(*a*) and 8(*b*) show cross-sectional views for explaining a second manufacturing method of the TFT 100 according to the present invention.

DETAILED DESCRIPTION OF EMBODIMENTS

A thin film transistor (TFT) 100 and a display device 200 according to an embodiment of the present invention are described below with reference to figures. However, the scope of the present invention is not limited to the embodiments below.

Figure 1:
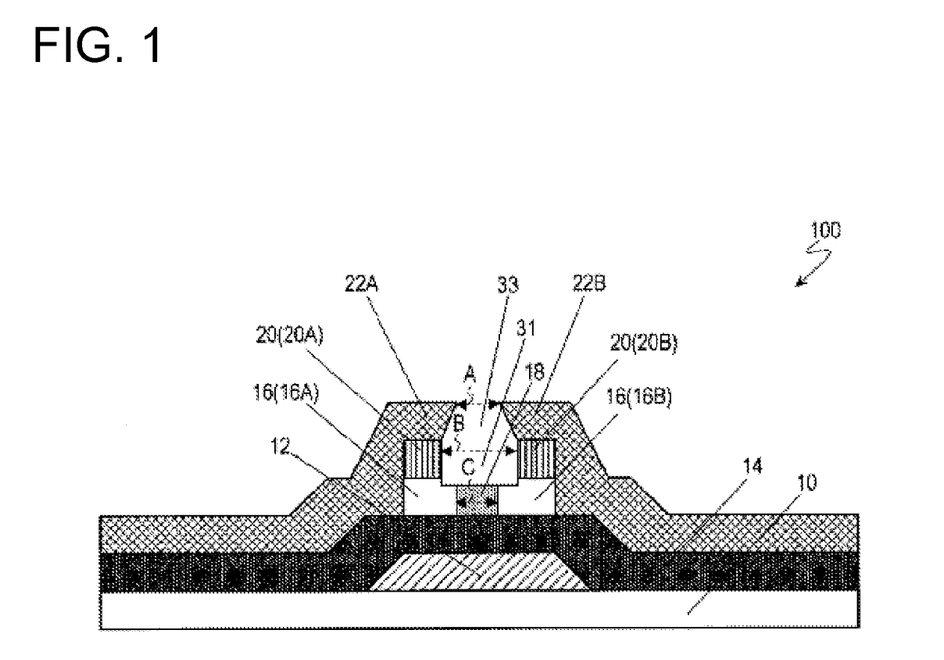
FIG. 1 is a cross-sectional view schematically showing a configuration of a thin film transistor 100 according to an embodiment of the present invention.

FIG. 1 is a cross-sectional view schematically showing a configuration of the TFT 100 of an embodiment of the present invention. As shown in FIG. 1, the TFT 100 is a thin film transistor of a reverse staggered type that has a bottom gate structure. The TFT 100 has a gate electrode (also referred to as a gate wiring line or a gate) 12 that is formed on a substrate 10 that is a glass substrate or the like, a gate insulating film (insulating layer) 14 formed on the substrate 10 so as to cover the gate electrode 12, an amorphous silicon layer (A-Si layer) 16 and a microcrystalline amorphous silicon layer (microcrystalline A-Si layer) 18 that are formed on the gate insulating film 14, an N-type semiconductor layer (semiconductor layer containing an impurity) 20 that is formed on the A-Si layer 16 and that is doped with an impurity, and a source electrode (source wiring line) 22A and a drain electrode (drain wiring line) 22B that are formed on the N-type semiconductor layer 20.

The microcrystalline A-Si layer 18 is obtained by annealing laminated amorphous silicon by irradiating it with a laser beam or the like such that the amorphous silicon is microcrystallized. The A-Si layer 16 and the microcrystalline A-Si layer 18 function as an active layer, and constitute a channel layer. The N-type semiconductor layer 20 is an n$^+$ amorphous silicon (n$^+$A-Si) layer, and functions as a contact layer. It is possible to use a P-type semiconductor layer instead of the N-type semiconductor layer 20. The N-type semiconductor layer 20 that is in contact with the source electrode 22A is referred to as a first contact portion 20A. The N-type semiconductor layer 20 that is in contact with the drain electrode 22B is referred to as a second contact portion 20B.

The A-Si layer 16 is constituted of a first amorphous silicon portion (first A-Si portion) 16A and a second amorphous silicon portion (second A-Si portion) 16B that are disposed so as to interpose the microcrystalline A-Si layer 18 therebetween. The first contact portion 20A is disposed so as to be interposed between the first A-Si portion 16A and the source electrode 22A. The second contact portion 20B is disposed so as to be interposed between the second A-Si portion 16B and the drain electrode 22B. Both the first A-Si portion 16A and the second A-Si portion 16B are in contact with only side surfaces of the microcrystalline A-Si layer 18, respectively. The microcrystalline A-Si layer 18 is not in direct contact with the first contact portion 20A or with the second contact portion 20B (not in direct contact with the N-type semiconductor layer 20), and is connected to the N-type semiconductor layer 20 through the first A-Si portion 16A and the second A-Si portion 16B (through the A-Si layer 16).

When viewed in the cross-section shown in FIG. 1, i.e., a cross-section that is normal to a plane of the substrate 10 and that cuts across the source electrode 22A and the drain electrode 22B, the width of a gap 33 between the source electrode 22A and the drain electrode 22B becomes wider as it approaches the N-type semiconductor layer 20 (the first contact portion 20A and the second contact portion 20B). Thus, the width of the gap 33 is wider in the lower portion than in the upper portion.

When viewed in this cross-section, the width (narrowest: upper portion width) A of the gap 33 is narrower than the width B of a region between the first contact portion 20A and the second contact portion 20B (gap 31 between the two contact portions). The width (greatest width) of the lower portion of the gap 33 is substantially the same as the width B. Further, because the microcrystalline A-Si layer 18 is formed by laser beam irradiation through a gap having the width A, the width C of the microcrystalline A-Si layer 18 is made narrower than the width B when viewed from this cross-section.

Next, a method of manufacturing the TFT 100 (first manufacturing method) is described with reference to FIGS. 2(a) to 2(f).

First, titanium (Ti) is laminated to a thickness of 100 to 500 nm on the substrate 10 by sputtering. Then, the titanium is patterned using photolithography and wet etching. Thereafter, a photoresist is removed, and the substrate is cleaned, thereby obtaining a multilayer structure of the substrate 10 and the gate electrode 12 shown in FIG. 2(a). In this step, gate wiring lines that are disposed in another portion are also formed.

The metal that forms the gate electrode 12 is not limited to titanium. The gate electrode 12 may be formed of a simple metal such as tantalum (Ta), aluminum (Al), indium tin oxide (ITO), tungsten (W), copper (Cu), chromium (Cr), or molybdenum (Mo), or of a material that is obtained by adding nitrogen, oxygen, or another metal to these metals. Alternatively, the gate electrode 12 may have a multilayer structure in which a plurality of layers formed of the materials above are combined. The gate electrode 12 can be formed by a vapor deposition method or the like instead of sputtering. Further, dry etching may be performed instead of wet etching.

Next, a silicon nitride layer (SiNx layer) that becomes the gate insulating film 14 is formed to a thickness of 200 to 500 nm by a plasma CVD (chemical vapor deposition) method, and an amorphous silicon layer 30 is laminated thereon to a thickness of 20 to 200 nm. Furthermore, the N-type semiconductor layer (n$^+$A-Si layer) 20 doped with an n-type impurity is laminated to a thickness of 20 to 200 nm. These layers may be formed continuously in a multi-chamber type device. Then, the amorphous silicon layer 30 and the N-type semiconductor layer 20 are patterned using photolithography and dry etching. Thereafter, a photoresist is removed, and cleaning is performed to obtain a multilayer structure having the shape shown in FIG. 2(b). In the step of laminating the N-type semiconductor layer 20, the N-type semiconductor layer 20 is formed by doping the amorphous silicon layer with an impurity after forming the layer or doping the layer with the impurity before or at the same time as the film formation.

Next, titanium is laminated to a thickness of 100 to 500 nm on the gate insulating film 14 by sputtering so as to cover the amorphous silicon layer 30 and the N-type semiconductor layer 20, thereby obtaining a metal layer 32. Then, a resist (photoresist) 40 is formed on the metal layer 32, and is pre-baked. Then, the resist 40 is shaped (the resist 40 is removed partially and cleaned) into a resist shape having an opening 41 shown in FIG. 2(c) by photolithography that includes exposure and development steps. The opening 41 is formed above the multilayer structure of the A-Si layer 30 and the N-type semiconductor layer 20.

After the resist 40 is shaped, a post-baking treatment is performed. The heating temperature of the resist during the post-baking is 150° C. or more and 160° C. or less. This temperature is 30° C. to 40° C. higher than a typical temperature for post-baking, which is 120° C. By performing the post-baking at this temperature, adhesion strength between the metal layer 32 formed of titanium and the resist 40 is improved.

Next, using the resist 40 as a mask, wet etching is performed to pattern the metal layer 32. At this time, because the adhesion strength between the metal layer 32 and the resist 40 is high, the gap 33 in a reverse tapered shape (the width of the upper portion is narrower than the width of the lower portion) is formed in the metal layer 32 under the opening 41. As shown in FIG. 2(d), by this patterning, the source electrode 22A and the drain electrode 22B are formed of the metal layer 32 Source wiring lines and drain wiring lines in another portion are also formed at the same time.

In the same manner as the material of the gate electrode 12, as the material of the metal layer 32, a single metal such as tantalum, aluminum, indium tin oxide, tungsten, copper, chromium, or molybdenum, or a material obtained by adding nitrogen, oxygen, or another metal to these metals may be used instead of titanium. Alternatively, the metal layer 32 may have a configuration in which a plurality of layers formed of these materials are laminated. Even when these materials or configurations are used, the gap 33 in a reverse tapered shape described above can be obtained. Even in the case of using these materials and configurations, the adhesion strength between the resist 40 and the metal layer 32 can be improved by setting the post-baking temperature of the resist at 150° C. or more and 160° C. or less, which is 30° C. to 40° C. higher than usual (120° C.).

When etching the metal layer 32, the reverse tapered shape can be obtained by making the etching time approximately 20% to 30% longer than standard etching time (etching time when post-baking is performed at a normal temperature and the reverse tapered shape is not formed). As an etchant, an etchant that is typically used for etching the respective metal materials may be used. If the metal layer 32 is formed of titanium and the film thickness is set to 100 nm, for example, standard etching time is approximately 45 to 50 seconds. However, in the present embodiment, etching time of approximately 55 to 65 seconds, which is approximately 20 to 30% longer than the standard etching time, is used.

Next, the N-type semiconductor layer 20 is patterned by dry etching to form the first contact portion 20A under the source electrode 22A and the second contact portion 20B under the drain electrode 22B. At this time, the entire N-type semiconductor layer 20 under the gap 33 is removed, and thus the gap 31 is formed between the first contact portion 20A and the second contact portion 20B. As a result, a channel layer that is formed only of the A-Si layer 30 is formed. Then, by removing the resist 40 and performing cleaning, the multilayer structure shown in FIG. 2(e) is obtained.

Next, as shown in FIG. 2(f), the A-Si layer 30 is irradiated with a laser beam 45 through the gaps 33 and 31 to selectively crystallize the A-Si layer 30, thereby obtaining the microcrystalline A-Si layer 18. As a result, the first A-Si portion 16A, the second A-Si portion 16B, and the microcrystalline A-Si layer 18 that is positioned between the first A-Si portion 16A and the second A-Si portion 16B are formed by using the A-Si layer 30. As the laser beam 45, an excimer laser is used, for example. As the laser beam 45, a CW (Continuous Wave) laser may be used instead of a pulse laser.

In the patterning step of the metal layer 32 and the N-type semiconductor layer 20, the patterning is performed such that the width A (width of the narrowest portion) of the upper portion of the gap 33 becomes narrower than the width B of the gap 31. Because of this, the width of the microcrystalline A-Si layer 18 that is s formed by the laser beam 45 emitted through these gaps becomes narrower than the width B of the gap 31. As a result, while the first A-Si portion 16A is brought into contact with the first contact portion 20A, and the second A-Si portion 16B is brought into contact with the second contact portion 20B, the microcrystalline A-Si layer 18 is not in direct contact with the first contact portion 20A or the second contact portion 20B (is not brought into contact with the N-type semiconductor layer 20). Further, one of the side surfaces of the microcrystalline A-Si layer 18 is in contact with the first A-Si portion 16A, and the other side surface is in contact with the second A-Si portion 16B. The upper surface of the microcrystalline A-Si layer 18 is not in contact with the N-type semiconductor layer 20.

According to the thin film transistor 100 of the present embodiment, the semiconductor layer thereof includes the microcrystalline A-Si layer 18, which results in the excellent ON current characteristics. Furthermore, the N-type semiconductor layer 20 (the first contact portion 20A and the second contact portion 20B) and the microcrystalline A-Si layer 18 are connected to each other through the A-Si layer 16 without being in direct contact with each other. Because of this, driving up of the OFF current is suppressed, and the leakage current is reduced. Furthermore, when manufacturing the thin film transistor 100, there is no need to newly add a special step. Because of this, it is possible to provide a high-quality thin film transistor by an efficient manufacturing method.

Next, a configuration of the display device 200 according to an embodiment of the present invention is described.

Figure 3:
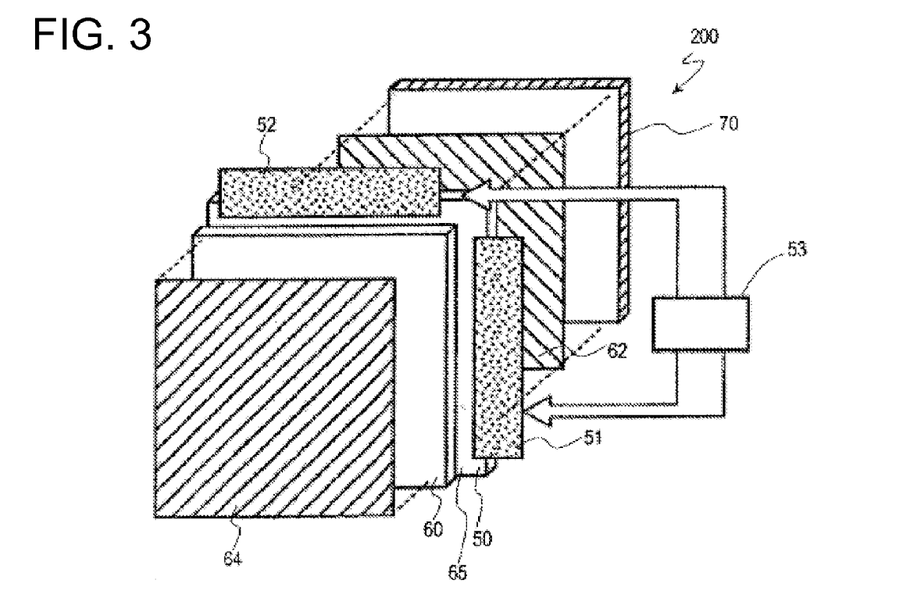
FIG. 3 is a perspective view schematically showing a configuration of a display device 200 according to an embodiment of the present invention.
Figure 4:
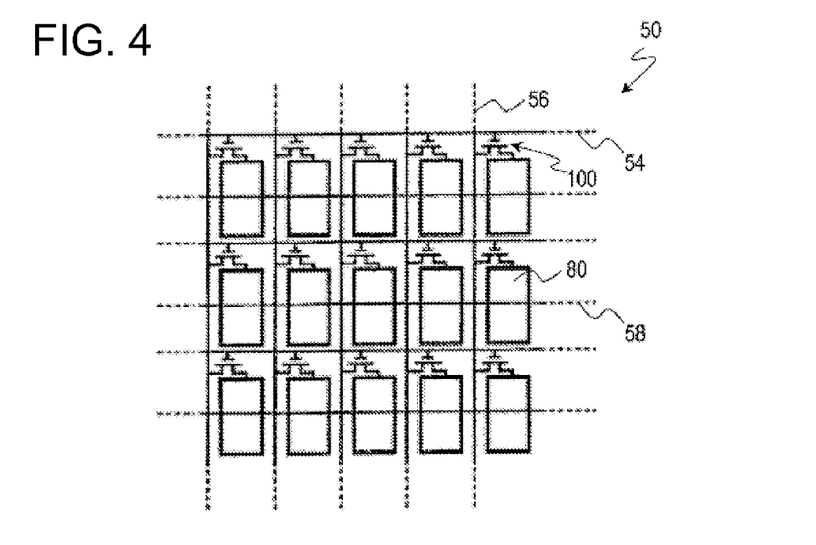
FIG. 4 is a plan view schematically showing a configuration of a TFT substrate 50 in the display device 200.
Figure 5:
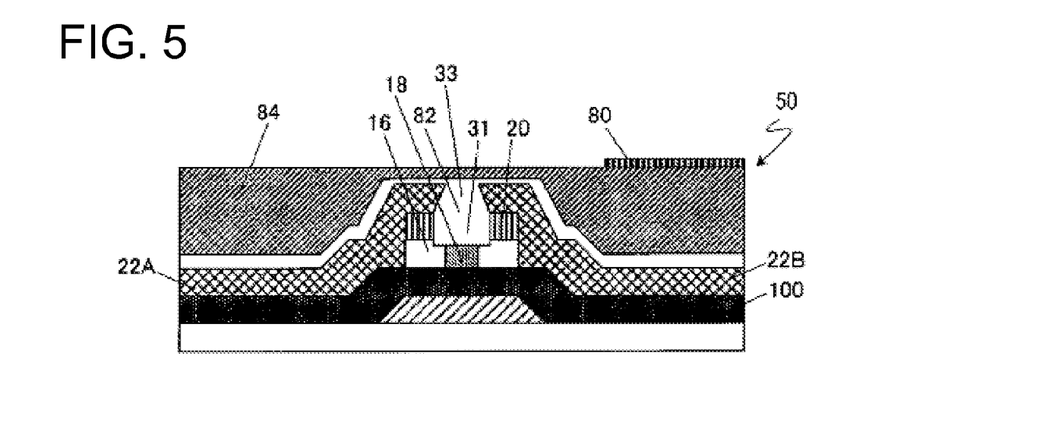
FIG. 5 is a cross-sectional view schematically showing a configuration near the thin film transistor 100 in the TFT substrate 50.

FIG. 3 is a perspective view schematically showing a configuration of the display device 200. FIG. 4 is a plan view schematically showing a configuration of a TFT substrate 50 in the display device 200. FIG. 5 is a cross-sectional view schematically showing a configuration near the thin film transistor 100 in the TFT substrate 50.

The display device 200 of the present embodiment is a liquid crystal display device. As shown in FIG. 3, the display device 200 has the TFT substrate 50 and an opposite substrate (CF substrate) 60 that face each other with a liquid crystal layer 65 interposed therebetween, polarizing plates 62 and 64 that are disposed on outer sides of the TFT substrate 50 and the opposite substrate 60, respectively, and a backlight 70 that emits light for display toward the polarizing plate 62.

As shown in FIG. 4, on the TFT substrate 50, a plurality of scan lines (gate bus lines) 54 and a plurality of signal lines (data bus lines) 56 are disposed so as to be orthogonal to each other. In the proximity of the respective intersections of the plurality of scan lines 54 and the plurality of signal lines 56, the TFTs 100 of an embodiment of the present invention are disposed in the respective pixels as active elements. One pixel is defined as a region that is enclosed by two scan lines 54 that are adjacent to each other and two signal lines 56 that are adjacent to each other. In each pixel, a pixel electrode 80 that is electrically connected to the drain electrode 22B of the TFT 100 and that is formed of ITO (Indium Tin Oxide), for example, is formed. An auxiliary capacitance line (may also be referred to as a storage capacitance line or a Cs line) 58 that extends in parallel with the scan lines 54 may be disposed between two scan lines 54 that are adjacent to each other.

The plurality of scan lines 54 and the plurality of signal lines 56 are connected to a scan line driver circuit 51 and a signal line driver circuit 52 shown in FIG. 3, respectively. The scan line driver circuit 51 and the signal line driver circuit 52 are connected to a control circuit 53. A scan signal that switches the state of the TFTs 100 between ON and OFF is supplied to the scan lines 54 from the scan line driver circuit 51 corresponding to control by the control circuit 53. Display signals (voltages applied to the pixel electrodes 80) are supplied to the plurality of signal lines 56 from the signal line driver circuit 52 corresponding to control by the control circuit 53.

The opposite substrate 60 has a color filter and a common electrode. In the case of the three-primary color display, the color filter includes R (red) filters, G (green) filters, and B (blue) filters that are respectively disposed corresponding to the pixels. The common electrode is formed so as to cover the plurality of pixel electrodes 80. Liquid crystal molecules between the electrodes are oriented in accordance with a difference in potentials between the common electrode and the respective pixel electrodes 80 in the respective pixels, thereby performing display.

As shown in FIG. 5, on the TFT 100, a protective layer 82 and an interlayer insulating film 84 are formed, and the pixel electrode 80 is formed on the interlayer insulating film 84. The protective layer 82 is laminated on the source electrode 22A and the drain electrode 22B so as to be in contact with these electrodes and to cover the TFT 100. The gaps 31 and 33 are filled by the protective layer 82. The interlayer insulating film 84 is formed on the protective layer 82. In the protective layer 82 and the interlayer insulating film 84, a not-shown contact hole for electrically connecting the pixel electrode 80 to the drain electrode 22B is formed.

In forming the protective layer 82, the interlayer insulating film 84, and the pixel electrode 80, first, the protective layer 82 that is a passivation layer is applied on the TFT 100. Then, a photosensitive insulating film material is applied thereon, and the protective layer 82 and the interlayer insulating film 84 are patterned by photolithography and dry etching. Then, after a resist is removed and cleaning is performed, ITO is formed to a thickness of 50 nm to 200 nm by sputtering, and the ITO is patterned by photolithography and wet etching to obtain the pixel electrode 80. Thereafter, the resist is removed, and the substrate is cleaned.

Next, with reference to a TFT that is a reference example, effects of the TFT 100 of the present embodiment are described.

Figure 6:
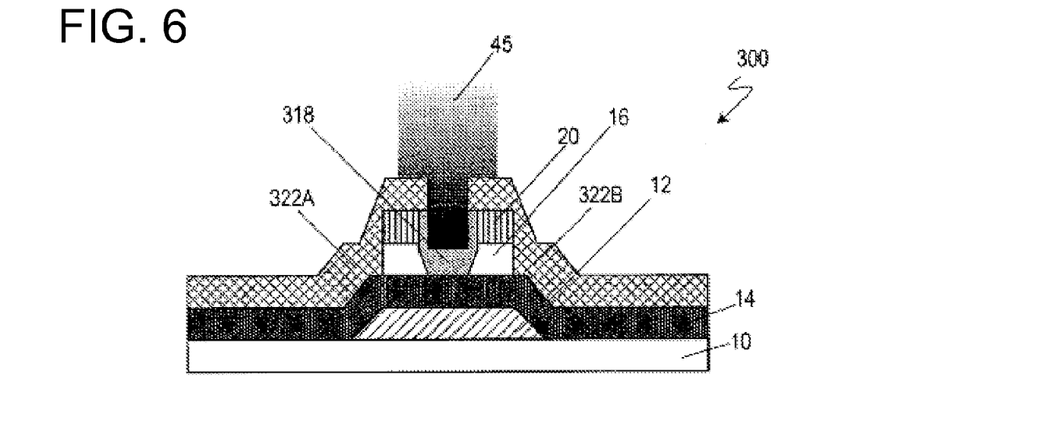
FIG. 6 is a cross-sectional view showing a configuration of a TFT 300 that is a first reference example.

FIG. 6 is a cross-sectional view showing a configuration of a TFT 300 that is a first reference example. Configurations of the substrate 10, the gate electrode 12, and the gate insulating film 14 of the TFT 300 are the same as those of the TFT 100 of an embodiment of the present application. However, in the TFT 300, a side surface of a source electrode 322A and a side surface of a drain electrode 322B on the N-type semiconductor layer 20 are formed substantially normal to a substrate plane. This is because, in forming the source electrode 322A and the drain electrode 322B of the metal film by photolithography, the temperature for post-baking a resist was lower than that in the manufacturing method of the TFT 100 of the present embodiment, and the adhesion strength between the resist and the metal film became thereby lower.

Because the source electrode 322A and the drain electrode 322B of the TFT 300 have the shape described above, in the etching step of the N-type semiconductor layer 20, side surfaces of the N-type semiconductor layer 20 are formed substantially normal to the substrate plane at substantially the same locations as the side surfaces of the source electrode 322A and the drain electrode 322B. Therefore, when microcrystallizing the A-Si layer 16 using the laser beam 45, a portion inside the gap, which is near the upper surface of the A-Si layer 16 and near the side surfaces of the N-type semiconductor layer 20 are also microcrystallized, thereby forming a microcrystalline A-Si layer 318.

Because of this, in the TFT 300, the source electrode 322A is brought into direct contact with the microcrystalline A-Si layer 318, and the drain electrode 322B is brought into direct contact with the microcrystalline A-Si layer 318, and as a result, a high OFF current is generated.

Figure 7:
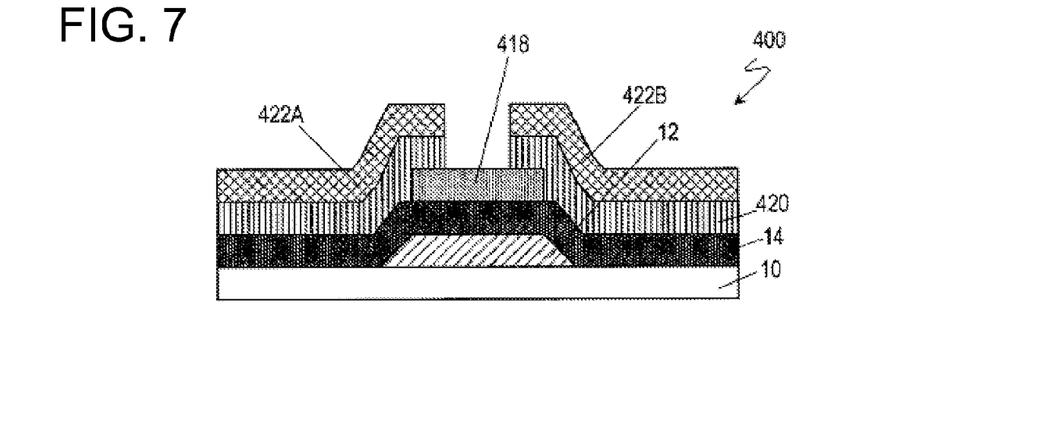
FIG. 7 is a cross-sectional view showing a configuration of a TFT 400 that is a second reference example.

FIG. 7 is a cross-sectional view showing a configuration of a TFT 400 that is a second reference example.

Configurations of the substrate 10, the gate electrode 12, and the gate insulating film 14 of the TFT 400 are the same as those of the TFT 100 of an embodiment of the present application. However, in the TFT 400, the channel region is constituted entirely of a microcrystalline A-Si layer 418, and does not have a configuration of the present invention, in which a microcrystalline A-Si layer is disposed between two A-Si layers. This is because, in a process step of the TFT 400, an A-Si layer was microcrystallized by laser annealing before forming an N-type semiconductor layer 420 on the A-Si layer.

When this manufacturing method is used, the entire A-Si layer is microcrystallized before the N-type semiconductor layer 420 is laminated thereon, and thus, the A-Si layer is not left in the channel layer. Because of this, in the TFT 400, the N-type semiconductor layer 420 and the microcrystalline A-Si layer 418 are brought into direct contact with each other, and as a result, a high OFF current is generated.

In the TFT 100 of an embodiment of the present invention, the source electrode 22A is not in direct contact with the microcrystalline A-Si layer 18, and the drain electrode 22B is not in direct contact with the microcrystalline A-Si layer 18. Further, the N-type semiconductor layer 20 and the microcrystalline A-Si layer 18 are not in direct contact with each other. Therefore, it is possible to prevent the problem of the high OFF current being generated. Further, according to the present invention, it is possible to manufacture the TFT 100 without adding a special process step.

Figure 2:
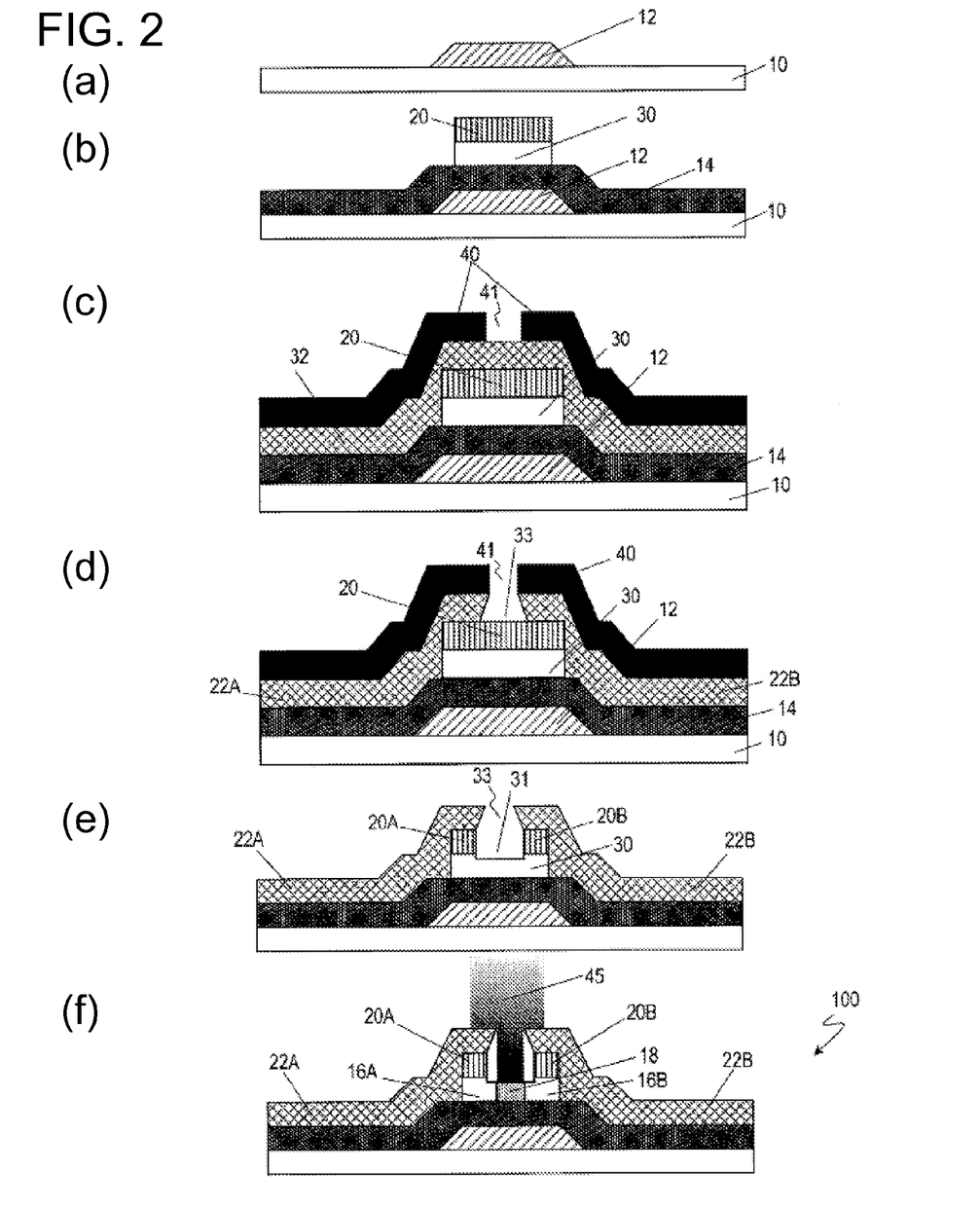
Figure 8:
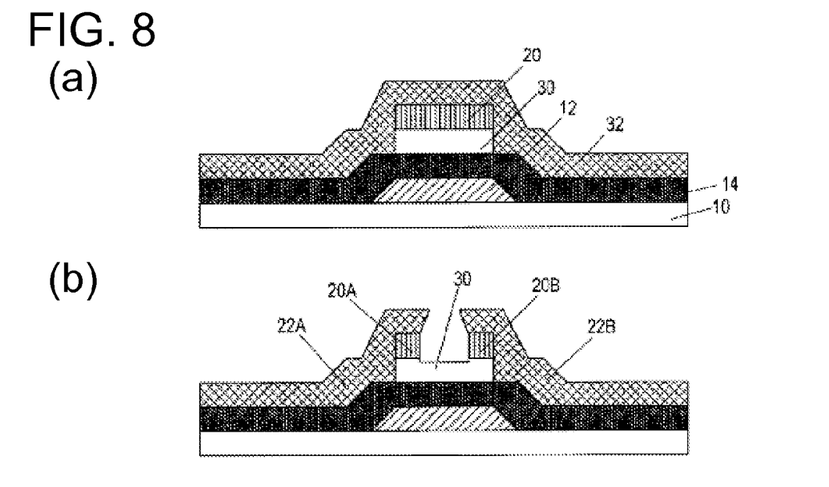

Next, with reference to FIG. 8, a second method of manufacturing the TFT 100 according to the present invention is described. In essence, the second manufacturing method is the same as the manufacturing method shown in FIG. 2. Therefore, only the different steps are described below.

FIG. 8(a) shows a multilayer structure after the steps described using FIGS. 2(a) to 2(c) (however, this is before applying the resist 40), i.e., a structure in which the gate electrode 12, the gate insulating film 14, the A-Si layer 30, the N-type semiconductor layer 20, and the metal layer 32 are formed on the substrate 10. In the manufacturing method shown in FIG. 2, the gate electrode 12 was obtained by patterning titanium by wet etching, but the gate electrode 12 may be formed by patterning using dry etching.

In the second manufacturing method, a resist is applied on the multilayer structure shown in FIG. 8(a); the resist is patterned using photolithography; the resist is post-baked at a temperature that is higher than usual as described above; and an etching treatment is performed with respect to the metal layer 32 and the N-type semiconductor layer 20 as described with reference to FIG. 2(c). However, in the second manufacturing method, the etching treatment is performed with respect to the metal layer 32 and the N-type semiconductor layer 20 at once.

In the etching treatment, first, the metal layer 32 is dry-etched to continuously pattern the metal layer 32 and the N-type semiconductor layer 20. At this time, because the adhesion strength between the metal layer 32 and the resist is high, a gap of a reverse tapered shape is formed in the metal layer 32, and a gap having the same width as that of a bottom portion of the gap in the metal layer 32 or wider is formed in the N-type semiconductor layer 20. As shown in FIG. 8(b), by this patterning, the source electrode 22A and the drain electrode 22B are respectively formed of the metal layer 32, and the first contact portion 20A and the second contact portion 20B are respectively formed of the N-type semiconductor layer 20.

As the etching time for the metal layer 32, time that is approximately 20% to 30% longer than standard etching time (etching time when the reverse tapered shape is not formed) is used. This way, the reverse tapered shape can be obtained. If the standard etching time is approximately 115 to 120 seconds, the etching time in the present embodiment is approximately 138 to 156 seconds.

With respect to the N-type semiconductor layer 20, power (product of a voltage and a current applied to electrodes of an etching device) during etching is set to approximately 90% to 70% of the standard power (in a case where the metal layer 32 and the N-type semiconductor layer 20 are not etched at once), and the etching time is made approximately 40% to 60% longer than the standard etching time in order to form the first contact portion 20A and the second contact portion 20B. As the etchant, an etchant that is typically used when etching the metal layer 32 and the N-type semiconductor layer may be used. If the standard etching power and etching time are approximately 700 W and 84 seconds, respectively, in the present embodiment, the etching power is approximately 490 to 630 W, and the etching time is approximately 118 to 135 seconds.

Next, by irradiating the A-Si layer with the laser beam 45 so as to selectively crystallize the A-Si layer as described with reference to FIG. 2(f), the microcrystalline A-Si layer 18 is obtained.

With this second method, the TFT 100 in which the source electrode 22A and the drain electrode 22B are not in direct contact with the microcrystalline A-Si layer 18, respectively, and in which the N-type semiconductor layer 20 and the microcrystalline A-Si layer 18 are not in direct contact with each other can also be obtained, and therefore, the problem of the occurrence of the high OFF current is prevented. Furthermore, in the second method, the metal layer 32 and the N-type semiconductor layer 20 can be etched together continuously, which can improve the manufacturing efficiency and thus reduce the manufacturing cost.

Figure 9:
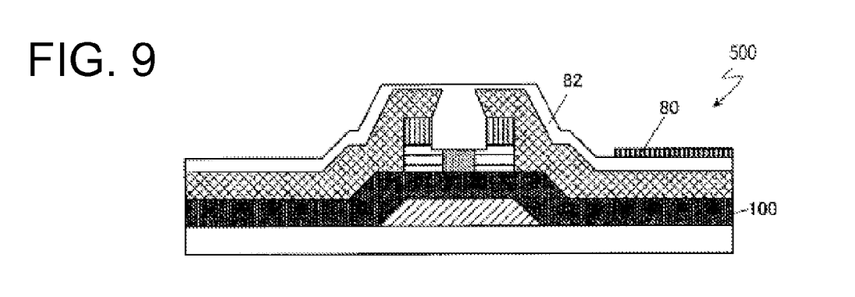
FIG. 9 is a cross-sectional view schematically showing a configuration of a TFT substrate 500 in a second display device according to an embodiment of the present invention.

Next, with reference to FIG. 9, a configuration of a TFT substrate 500 in a second display device according to an embodiment of the present invention is described. The TFT substrate 500 has the same configuration as the configuration shown in FIG. 5 except that the interlayer insulating film 84 is not formed on the TFT 100, and the pixel electrode 80 is formed so as to be in contact with the protective layer 82. The method of manufacturing the protective layer 82 and the pixel electrode 80 are the same as the method described with reference to FIG. 5. Therefore, the explanation is omitted.

The second display device does not have the interlayer insulating film 84. Therefore, it is possible to improve the manufacturing efficiency and thus reduce the cost.

INDUSTRIAL APPLICABILITY

The present invention is suitably used for a display device provided with an active matrix substrate having a thin film transistor such as a liquid crystal display device, an organic electroluminescence (EL) display device, and an inorganic electroluminescence display device, an imaging device such as a flat panel type X-ray image sensor device, and an image input device such as a contact type image input device and a fingerprint reading device.

DESCRIPTION OF REFERENCE CHARACTERS 10 substrate
12 gate electrode (gate wiring line)
14 gate insulating film (insulating layer)
16, 30 amorphous silicon layers (A-Si layers)
16A first amorphous silicon portion (first A-Si portion)
16B second amorphous silicon portion (second A-Si portion)
18 microcrystalline amorphous silicon layer (microcrystalline A-Si layer)
20 N-type semiconductor layer (semiconductor layer containing an impurity, $n^+$A-Si layer)
20A first contact portion
20B second contact portion
22A source electrode (source wiring line)
22B drain electrode (drain wiring line)
31, 33 gaps
32 metal layer
40 resist
41 opening
45 laser beam
50 TFT substrate
51 scan line driver circuit
52 signal line driver circuit
53 control circuit
54 scan line
56 signal line
58 auxiliary capacitance line
60 opposite substrate
62, 64 polarizing plates
65 liquid crystal layer
70 backlight
80 pixel electrode
82 protective layer
84 interlayer insulating film
100 thin film transistor (TFT)
200 display device
300 TFT (first reference example)
400 TFT (second reference example)
500 TFT substrate

The invention claimed is:

1. A thin film transistor, comprising:
a gate electrode formed on a substrate;
an insulating layer formed so as to cover said gate electrode;
a microcrystalline amorphous silicon layer and an amorphous silicon layer that are formed on said insulating layer;
a semiconductor layer containing an impurity formed on said amorphous silicon layer; and
a source electrode and a drain electrode that are formed on said semiconductor layer containing an impurity,
wherein said microcrystalline amorphous silicon layer and said semiconductor layer containing an impurity are connected to each other through said amorphous silicon layer without being in direct contact with each other,
wherein said semiconductor layer containing the impurity includes a first contact portion that is in contact with said source electrode and a second contact portion that is in contact with said drain electrode, and
wherein when viewed in a cross-section that is normal to a plane of said substrate and that cuts across said source electrode and said drain electrode, a width of said microcrystalline amorphous silicon layer is narrower than a width of a space between said first contact portion and said second contact portion.

2. The thin film transistor according to claim 1, wherein when viewed in said cross-section, a width of a space between said source electrode and said drain electrode is narrower than the width of the space between said first contact portion and said second contact portion.

3. The thin film transistor according to claim 1, wherein when viewed in said cross-section, a width of a space between said source electrode and said drain electrode becomes wider as it approaches said first contact portion and said second contact portion.

4. The thin film transistor according to claim 1, wherein said amorphous silicon layer includes a first amorphous silicon portion that is in contact with said first contact portion and a second amorphous silicon portion that is in contact with said second contact portion,
   wherein said microcrystalline amorphous silicon layer is disposed between said first amorphous silicon portion and said second amorphous silicon portion, and
   wherein said first amorphous silicon portion and said second amorphous silicon portion are in contact with only side surfaces of said microcrystalline amorphous silicon layer, respectively.

5. The thin film transistor according to claim 1, wherein said source electrode and said drain electrode are formed of titanium.

6. A display device, comprising a TFT substrate in which the thin film transistor according to claim 1 is disposed in each pixel.

7. The display device according to claim 6, comprising a plurality of pixels arranged in a matrix,
   wherein said thin film transistor and a pixel electrode are disposed corresponding to each of said plurality of pixels, and
   wherein said pixel electrode is formed on a protective layer that is formed so as to cover said thin film transistor.

8. The display device according to claim 7, wherein an interlayer insulating film is formed between said pixel electrode and said protective layer.

* * * * *